United States Patent
Baets et al.

(10) Patent No.: US 10,338,313 B2
(45) Date of Patent: Jul. 2, 2019

(54) ON-CHIP BROADBAND LIGHT SOURCE

(71) Applicants: UNIVERSITEIT GENT, Ghent (BE); IMEC VZW, Leuven (BE)

(72) Inventors: Roeland Baets, Deinze (BE); Günther Roelkens, Schellebelle (BE); Andreas De Groote, Sint-Antelinks (BE); Paolo Cardile, Ghent (BE); Ananth Subramanian, Ghent (BE)

(73) Assignees: UNIVERSITEIT GENT, Ghent (BE); IMEC VZW, Leuven (BE)

( * ) Notice: Subject to any disclaimer, the term of this patent is extended or adjusted under 35 U.S.C. 154(b) by 0 days.

(21) Appl. No.: 15/753,700

(22) PCT Filed: Aug. 22, 2016

(86) PCT No.: PCT/EP2016/069840
§ 371 (c)(1),
(2) Date: Feb. 20, 2018

(87) PCT Pub. No.: WO2017/032754
PCT Pub. Date: Mar. 2, 2017

(65) Prior Publication Data
US 2018/0239089 A1    Aug. 23, 2018

(30) Foreign Application Priority Data
Aug. 21, 2015  (EP) .................................... 15182041

(51) Int. Cl.
*G02B 6/12*     (2006.01)
*G02B 6/122*    (2006.01)
(Continued)

(52) U.S. Cl.
CPC .......... *G02B 6/1228* (2013.01); *G02B 6/131* (2013.01); *H01L 33/0045* (2013.01);
(Continued)

(58) Field of Classification Search
CPC .................. G02B 6/1228; G02B 6/131; G02B 2006/12061; G02B 2006/12121;
(Continued)

(56) References Cited

U.S. PATENT DOCUMENTS

| 6,339,606 B1 | 1/2002 | Alphonse |
| 2005/0094924 A1 | 5/2005 | Forrest et al. |
| 2016/0252692 A1* | 9/2016 | Hofrichter ............ H01S 5/0014 250/227.11 |

OTHER PUBLICATIONS

European Search Report from EP Application No. 15182041.2, dated Feb. 29, 2016.
(Continued)

*Primary Examiner* — John Bedtelyon
(74) *Attorney, Agent, or Firm* — Workman Nydegger

(57) ABSTRACT

An on-chip broadband radiation source, and methods for its manufacture such that a photonics IC comprises an optical waveguide such as a semiconductor waveguide, a thin III-V material membrane with absorption capability for absorbing an optical pump signal induced in the waveguide. The III-V membrane comprises a LED implemented therein. The photonics IC also comprises a coupling means between the waveguide and the membrane. The device provides a broadband radiation source at a wavelength longer than the wavelength of the transferred radiation. The broadband signal can then be coupled out through the waveguide and used in the chip.

17 Claims, 8 Drawing Sheets

(51) Int. Cl.
  *H01L 33/00* (2010.01)
  *H01L 33/58* (2010.01)
  *H01L 33/30* (2010.01)
  *H01S 5/026* (2006.01)
  *G02B 6/13* (2006.01)

(52) U.S. Cl.
  CPC .......... *H01L 33/0079* (2013.01); *H01L 33/30* (2013.01); *H01L 33/58* (2013.01); *H01S 5/026* (2013.01); *G02B 2006/12061* (2013.01); *G02B 2006/12097* (2013.01); *G02B 2006/12121* (2013.01); *G02B 2006/12123* (2013.01)

(58) Field of Classification Search
  CPC ........... G02B 2006/12097; G02B 2006/12123; H01L 33/30; H01L 33/58; H01L 33/0045; H01L 33/0079; H01S 5/026
  See application file for complete search history.

(56) References Cited

OTHER PUBLICATIONS

De Groote et al., "Heterogeneously Integrated III-V-On-Silicon Multibandgap Superluminescent Light-Emitting Diode with 290 nm Optical Bandwidth," Optics Letters, vol. 39, No. 16, Aug. 15, 2014, pp. 4784-4787.

De Groote et al., "A Waveguide Coupled LED on SOI by Heterogeneous Integration of InP-Based Membranes," IEEE, 2015, pp. 31-32.

Roelkens et al., "Light Emission and Enhanced Nonlinearity in Nanophotonic Waveguide Circuits by III-V/Silicon-On-Insulator Heterogeneous Integration," Journal of Applied Physics, vol. 104, 2008, 7 Pages.

International Search Report from PCT Application No. PCT/EP2016/069840, dated Nov. 23, 2016.

\* cited by examiner

ON-CHIP BROADBAND LIGHT SOURCE

FIELD OF THE INVENTION

The invention relates to the field of photonics integrated circuits. More specifically it relates to integrated circuits with an on-chip broadband source.

BACKGROUND OF THE INVENTION

Photonic integrated circuits, used in a wide range of applications from data transmission and telecommunications to sensing or microscopy, often integrate multiple photonic functions, covering a wide optical wavelength band (from visible to mid-infrared wavelengths). Silicon is a well-established material in electronics and by leveraging the technologies and tools of microelectronics industry silicon is also increasingly becoming the material-of-choice for various photonics related applications. But due to its indirect bandgap, silicon remains an inefficient light emitter, which is a huge drawback particularly for applications related to spectroscopic biosensing, where an efficient broadband light source fully integrated onto photonics circuitry is desirable. The present-day solutions have low power output and low efficiency. For example in heterogeneous integration, semiconductor material from the group elements of the groups 3 and 5 of the periodic table (usually called III-V materials, in the field of semiconductors) is bonded on top of the silicon waveguide. The III-V stack can be processed so as to obtain different types of devices, such as electrically pumped LEDs, in which a broadband light is generated by electrical pumping inducing emission of light in all the directions and where a portion of the light is coupled back to the silicon waveguide. This requires very complex design and fabrication, consumes higher power and is susceptible to processing related issues. While III-V materials have demonstrated higher efficiencies in other applications, such as lasers, the efficiency of these heterogeneous integrated LEDs is very low and the output is weak. Other possible solutions are electrically pumped all-silicon light sources, based on introducing defects or rare-earth doping in silicon (because of the indirect bandgap of this semiconductor), or nanostructuring the silicon itself. The production of these devices is very time-consuming and/or expensive. Besides, all these solutions are not efficient in terms of emitted power in general. A different solution has been proposed in which a light source, such as a laser, is coupled to an optical waveguide. This solution is not satisfactory because the devices rely heavily on a very exact optical alignment, which results in an expensive production and strict packaging requirements, further increasing production costs.

SUMMARY OF THE INVENTION

It is an object of embodiments of the present invention to provide a highly efficient on-chip broadband source, as well as to provide methods for manufacturing such an on-chip broadband radiation source. It is an advantage that a reliable photonic circuit with a low consumption and a highly efficient on-chip broadband source can be obtained.

The object is obtained by devices and methods according to aspects of the present invention.

The present invention relates to a photonics integrated circuit with on-chip broadband radiation source, the photonics integrated circuit comprising at least one optical waveguide and a LED structure implemented on a III-V membrane (which could consist of several active layers in between, e.g. quantum well layers) with a thickness between $\lambda/20 \cdot n1$ and $\lambda/2 \cdot n1$, where $\lambda$ is the operating wavelength and $n1$ is the geometric average refractive index of the III-V membrane material, the III-V membrane being positioned on top of the optical waveguide. The refractive index $n1$ fulfills the relationship: $n1-n0>1$, $n0$ being the refractive index of the cladding material around, i.e. surrounding, the III-V membrane at least in the vertical direction, i.e. perpendicular to the plane of the III-V membrane. The optical waveguide comprises a coupling means for transferring an optical pump signal from the optical waveguide up to the III-V membrane, and the III-V membrane has an absorption capability for absorbing the optical pump signal transferred up to the III-V membrane so as to pump the LED structure thus inducing broadband radiation at a wavelength longer than the wavelength of the optical pump signal. The III-V membrane furthermore is adapted for transferring back the broadband emitted light to the optical waveguide mentioned above.

It is an advantage of embodiments according to the present invention that an efficient broadband light source can be obtained in a silicon integrated circuit.

It is an advantage of embodiments according to the present invention that a reliable light source can be obtained.

It is an advantage of embodiments according to the present invention that combine low power consumption with high efficiency coupling into optical waveguides, e.g. in a semiconductor chip, e.g. a silicon chip. It thereby is an advantage that at the same time also broadband radiation can be obtained.

It is an advantage of embodiments according to the present invention that the distance between the LED and the waveguide can be minimized. Since the LED in embodiments of the present invention is optically pumped, there is no need for electrodes between the LED and the waveguide as required for electrically pumping of the LED. Consequently, the spacing between the LED and the waveguide can be optimized, resulting in efficient incoupling of the LED radiation into the waveguide.

It is an advantage of embodiments according to the present invention that efficient optical pumping of the LED can be obtained in view of the large overlap between the optical pump power and the active area of the LED.

The optical waveguide may be arranged for receiving an optical pump signal and for guiding the optical pump signal in the optical waveguide towards the III-V membrane.

The photonics circuit furthermore may comprise an integrated radiation source for generating the optical pump signal, said integrated radiation source being coupled to the optical waveguide for directing the optical pump signal towards the III-V membrane.

It is an advantage of embodiments according to the present invention that use can be made of very efficient integrated radiation sources. Alternatively also external radiation sources could be used as pumping sources, such sources then being coupled to the waveguides e.g. via optical fibers.

The integrated radiation source may be a VCSEL.

The optical waveguide and said thin III-V membrane may be configured with respect to each other so as to couple the broadband radiation towards the optical waveguide. It is an advantage of embodiments of the present invention that due to the specific configuration of high refractive index contrast in the materials, as well as through the dimensional configuration used, an efficient coupling can occur. The coupling of broadband radiation into the optical waveguide may be up to at least 5%, e.g. 20% or better, which is high compared to several or most prior art solutions.

The coupling means may be provided on the optical waveguide.

The coupling means may be a taper, a grating or any other coupling means that allows efficient coupling of the pump radiation signal towards the III-V membrane and the LED radiation from the III-V membrane.

It is an advantage of embodiments of the present invention that use can be made of existing coupling means such as a taper.

The optical waveguide may be a semiconductor-on-insulator waveguide, e.g. a silicon on-insulator waveguide.

It is an advantage of embodiments of the present invention that a powerful radiation source can be obtained as use can be made of e.g. III-V materials, compared to all-silicon solutions. The optical waveguide may be a semiconductor waveguide, a dielectric waveguide, a glass waveguide, a polymer waveguide, etc.

The III-V material may have a bandgap selected so that the pump signal can be absorbed and the spontaneous emission corresponds with the optical waveguide.

The present invention also relates to a method for manufacturing a photonics integrated circuit, the method comprising
obtaining a substrate comprising at least one optical waveguide
combining III-V material with said optical waveguide so as to form a LED on the optical waveguide,
wherein the method furthermore comprises introducing a coupling means in the at least one optical waveguide or the III-V membrane for transferring an optical pump signal from the optical waveguide up to the III-V membrane, and wherein combining the III-V material with the optical waveguide comprises creating a III-V membrane with a thickness between $\lambda/20*n1$ and $\lambda/2*n1$, where $\lambda$ is the operating wavelength and $n1$ the refractive index of the III-V membrane material, and a high refractive index contrast in at least the vertical direction, $n1-n0>1$, with $n0$ being the refractive index of the cladding material of the III-V membrane, and having an absorption capability for absorbing the optical pump signal transferred up to the III-V membrane so as to pump the LED structure thus inducing broadband radiation at a wavelength longer than the wavelength of the optical pump signal.

Said combining III-V material with the optical waveguide may comprise transferring III-V material to the optical waveguide so that the III-V material is on top of the optical waveguide, and processing said III-V material to create the LED.

Said combining III-V material with the optical waveguide may comprise creating a LED structure based on III-V material, and combining the substrate and the LED structure so as to obtain the LED on the optical waveguide. It thereby is an advantage that the LED structure can be processed separately from the substrate and that processing conditions for the LED structure can be selected independently of the substrate.

Said combining III-V material with the optical waveguide may comprise directly growing a LED structure on top of the optical waveguide on the substrate.

Creating a III-V membrane may comprise heterogeneously bonding the III-V membrane on the optical waveguide.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
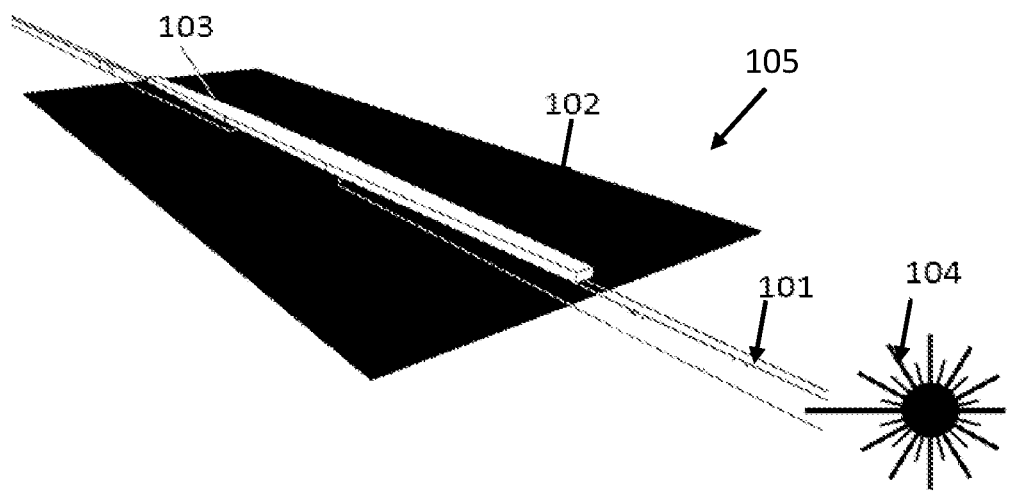
FIG. 1 illustrates a schematic photonics device according to embodiments of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Whereas in embodiments illustrating the devices and methods of the present invention reference will be made to a photonics integrated circuit making use of a silicon on insulator (SOI) material system, embodiments of the present invention are not limited thereto and relate to use of any suitable platform for implementing photonics integrated circuits (PIC). Silicon-on-Insulator is a very interesting material system for highly integrated photonic circuits. The high refractive index contrast allows photonic waveguides and waveguide components with submicron dimensions to guide, bend and control light on a very small scale so that various functions can be integrated on a chip. Such waveguides allow a high level of miniaturization, which is advantageous. Furthermore also for these waveguide types radiation can be efficiently coupled in and out the photonics integrated circuit, using embodiments according to the present invention. Using Silicon-on-insulator also has some technological advantages. Due to the CMOS industry, silicon technology has reached a level of maturity that outperforms any other planar chip manufacturing technique by several orders of magnitude in terms of performance, reproducibility and throughput.

Waveguides include a core comprising a suitable material which is transparent for a suitable wavelength, and a cladding comprising a second material, surrounding the first material, with a typically lower optical index than the waveguide. In general, waveguides are classified according to the core, hence when in embodiments of the present invention reference is made to "silicon waveguides", reference is made to waveguides which comprise silicon in the core.

In a first aspect, the present invention relates to a photonics integrated circuit (PIC) comprising an on chip efficient broadband radiation source. According to embodiments of the present invention, the on-chip efficient broadband radiation source is a LED that is optically pumped within the photonics integrated circuit (PIC), i.e. via a waveguide integrated in the photonics integrated circuit. The LED typically is made based on a III-V material whereas the photonics integrated circuit can be based on a passive optical material, such as for example a semiconductor based material. In one advantageous embodiment, the photonics integrated circuit may be based on a semiconductor-on-insulator material, e.g. a silicon-on-insulator material, such that the processing of the photonics integrated circuit has the advantages as mentioned above.

Since the LED structure will be optically pumped from within the photonics integrated circuit, electrical contacts as for example required for electrically pumping, can be avoided, allowing an easier fabrication of the device. In addition this allows for the high refractive index contrast which induces the high optical confinement of the pump signal and the high collection efficiency of the omnidirectional spontaneous emission. In addition, the distance between the waveguide and the LED structure can be very small, thus allowing a better coupling of the pumping light mode into the III-V material. This generates higher intensity of the emitted broadband light into the photonics integrated circuit. Similarly, since the configuration between the LED structure and the waveguide can be optimized for efficient coupling when on-chip optical pumping is used, ensuring a higher fraction of emitted radiation in the photonics integrated circuit can be obtained, compared to for example the situation where a LED structure would be pumped from outside the photonics integrated circuit. Furthermore, the overall setup can be less complex if pumping is performed from within the photonics integrated circuit.

In a first aspect, the photonics IC comprising at least an optical waveguide (WG). The optical waveguide may be any type of optical waveguide. In advantageous embodiments, the optical waveguide may be a semiconductor on insulator based waveguide, e.g. based on an SOI material system. The present invention is not limited thereto, and the WG may comprise any suitable material as long as it shows good coupling with the membrane, for example dielectric waveguide, glass and/or polymer waveguide, etc.

The optical waveguide is used for optically pumping a LED structure and therefore is arranged to obtain an optical pump signal. The latter may be stemming from an on chip pump radiation source or from an off-chip pump radiation source. The pump radiation source may be part or not part of the system. The photonics integrated circuit furthermore comprises a LED structure, implemented in III-V material, e.g. a thin layer or layer structure of III-V. Such thin shaped III-V material is referred to as a III-V material membrane. The membrane is positioned on top of the waveguide. The waveguide and the III-V material membrane are configured in position, material type and arrangement so that efficient coupling from the optical pump signal to the LED structure is possible, that the optical pump signal is accurately absorbed and that created LED radiation is efficiently coupled back into the waveguide for use in the photonics integrated structure. The coupling is performed through a suitable coupling means which can efficiently transfer radiation, such as an optical pump signal, from the waveguide to the membrane. On the other hand, the membrane presents high absorption capability due to the high optical confinement. (>10% for a multi-quantum-well stack). Radiation transferred to the membrane (e.g. an optical pump signal) can be efficiently absorbed in the membrane and spontaneous emission can be efficiently collected in the waveguide. The LED material is selected such that broadband radiation is induced at a longer wavelength than the wavelength of the optical pump.

Where in embodiments of the present invention reference is made to "thin membrane" with high refractive index contrast, reference is made to a membrane whose thickness is within a determined range and a minimal refractive index contrast. This range of thicknesses depends on the wavelength of radiation crossing the membrane and the optical index of the membrane material. According to embodiments of the present invention, the membrane is an optically thin membrane comprising III-V material, whose thickness t is larger than the wavelength of the radiation divided by twentyfold the optical index of the membrane, but smaller than the wavelength of the radiation divided by twice the optical index of the membrane. The refractive index contrast is said high when the geometric average refractive index of the membrane (n1) is sufficiently higher than that of the cladding (n0). Hence for a given radiation with a wavelength lambda ($\lambda$), a material of optical index n1 in a surrounding material of n0 would form a thin membrane if its thickness t follows the relation:

$$\lambda/(20*n1) < t < \lambda/(2*n1) \text{ with } n1-n0 > 1$$

It is to be noticed that where in embodiments of the present invention reference is made to the refractive index n1 of the membrane, reference is made to the average refractive index of the membrane. If for example the membrane consists of a plurality of layers, n1 refers to the average refractive index, averaged over the different layers.

Furthermore, where in embodiments of the present invention reference is made to the refractive index n0 of the cladding material that is below the membrane, i.e. the cladding layer may correspond with the cladding layer of the waveguide or with other material layers. If the cladding consists of several layers, the refractive index n0 corresponds with the average refractive index, averaged over the different layers.

Figure 12:
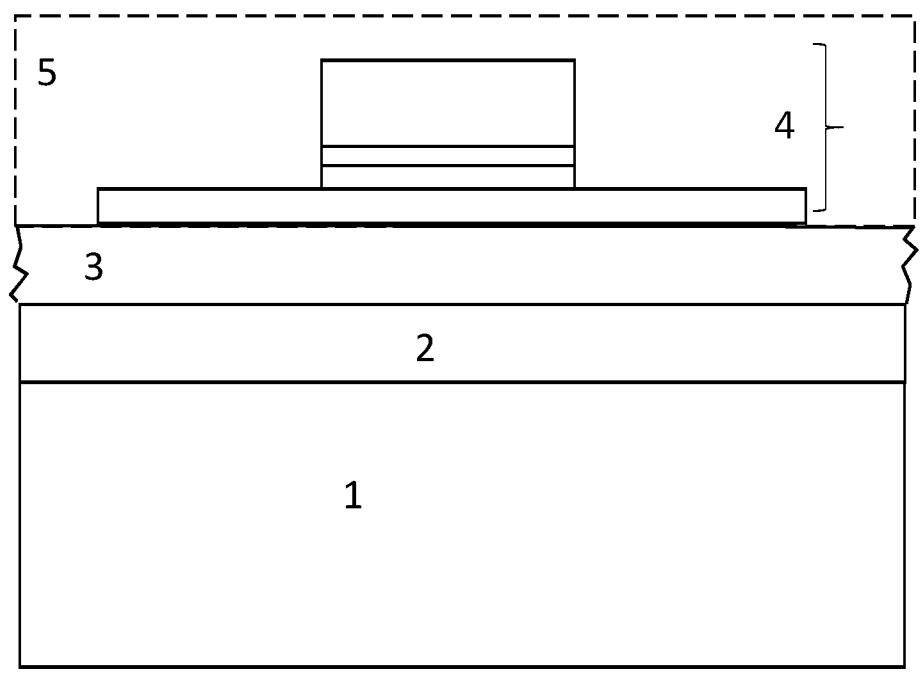
FIG. 12 and FIG. 13 illustrate configurations shown in cross-section for embodiments according to the present invention.

By way of illustration, embodiments of the present invention not limited thereto, two different configurations are described. In a first configuration, shown in FIG. 12, an embodiment is shown wherein no silicon is present under the membrane. The refractive index n1 is then defined as the geometrical average of the index of all layers shown in the LED structure 4 indicated in the device. Layer 5 constitutes the upper cladding layer for the LED and the combination of layer 2, corresponding in this example with a SiO2 layer, and layer 3, being a bonding layer in this example, corresponds with the lower cladding layer. The refractive index n0 is then defined as the index of the upper or lower cladding region that has a lower index value.

Figure 13:
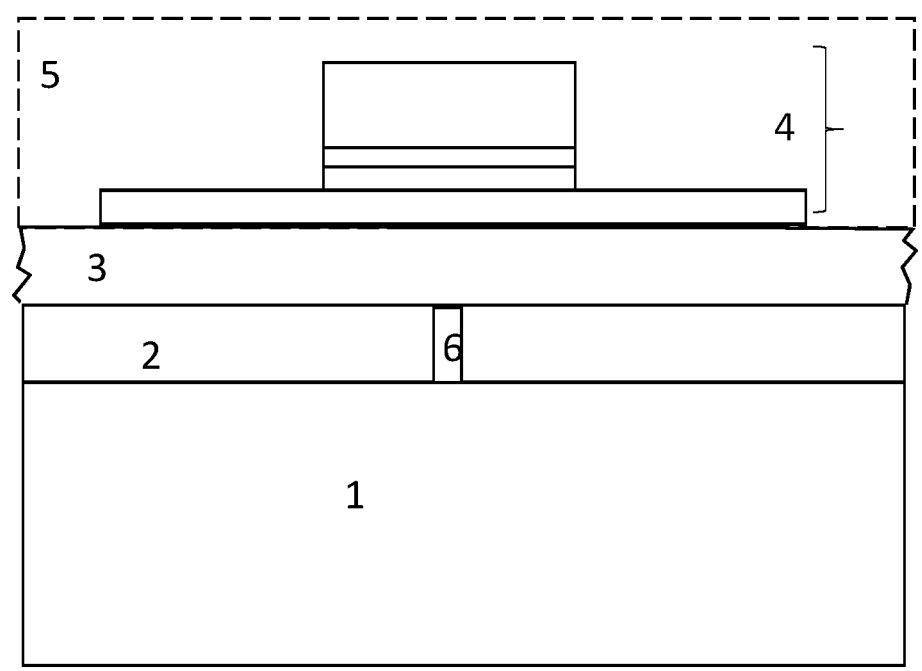

In FIG. 13, a configuration is shown wherein a narrow silicon taper (region 6) is present underneath the LED. Again n1 is defined as the geometrical average of the index of all the layers shown of the LED. Layer 5 is again the upper cladding layer and the bonding layer 3, the SiO2 layer 2 and the Si taper tip region 6 form the lower cladding region. The refractive index n0 is defined as the average index of the upper or lower cladding region that has a lower index value.

The configurations results in an efficient and reliable broadband light source, which is optimal for sensing or microscopic applications, which may be easily integrated in a silicon PIC such as a silicon chip, and presents low power consumption and high efficiency coupling.

It is an advantage of the present invention that a pure optical device can be obtained. Because the LED in embodiments of the present invention can be optically pumped, the spacing between the waveguide and the LED can be minimized and an optimal distance between the two can be obtained for an efficient coupling.

Further, the LED in embodiments of the present invention can be operated either in reflection or in transmission. Given the strong pump absorption, the absorption center concentration may be highest at the incoming portion of the overlap between the waveguide and the LED material, e.g. at an incoming portion of a taper positioned at the overlap between the waveguide and the III-V material and lower towards the end of the III-V waveguide due to pump depletion. Such absorption center concentration may correspond with an induced carrier concentration profile. Hence, for optical pumping signal in transmission, the optimal length of the device may not be very large, because it may not be pumped completely to transparency and hence absorb the signal. A signal in reflection does not suffer from this drawback. In embodiments of the present invention using signal in reflection, a (de)multiplexer circuit may be added for (de)multiplexing the signals.

The LED can be optically excited by the pump light guided to the LED via the waveguide further making use of, for example, a laser (for example a laser coupled by horizontal couplers, or by flip-chipping a vertical-cavity surface emitting laser (VCSEL) on top of grating couplers onto the Si chip) at a pump wavelength shorter than the LED typical band. The emitted light is collected by the same waveguide mode ensuring the best possible spectral resolution. Besides, the design ensures optimum excitation with the pump and high collection efficiency of at least 5%, e.g. 20% or better.

According to some embodiments of the present invention, the waveguide may be optimized in shape and material for bringing the optical pump power to the LED material, designed for forcing the optical pump signals towards the LED and for optimizing the overlap of the pump power with the active layer. The LED material may be optimized in thickness and type such that absorption of the optical pump is optimized and spontaneous emission is enhanced towards the waveguide mode of the cross section, enabling high efficient coupling of the generated LED radiation to the waveguide, e.g. the silicon photonics waveguide.

Some embodiments of the device may comprise a LED comprising a III-V material stack. For example, the LED and membrane may be obtained from a III-V substrate, e.g. a wafer or a coupon, by processing, the present invention not being limited thereto. Some embodiments may further comprise quantum dots and quantum wells forming the LED. For example, some embodiments may comprise at least one quantum well. Because the confinement per quantum well of the signal is virtually independent of the number of quantum wells, it is advantageous to introduce a high number of quantum wells in the optimal thickness at which there is maximum spontaneous emission and confinement.

FIG. 1 shows a simple configuration according to some embodiments of the present invention. The waveguide, for example a silicon waveguide 101, is partially covered by a III-V layer, which may be referred to as the III-V membrane according to embodiments of the present invention. The waveguide 101 comprises of a core region 101, III-V side cladding region 102, III-V core region 103, and a surrounding cladding region 105. In at least one overlapping region where overlap occurs between the waveguide 101 and the III-V layer, absorption centers are present for absorbing a pump optical signal. Such absorption centers may be one or more quantum wells and/or quantum dots, etc. In some embodiments of the present invention, the III-V LED may be directly implemented on the III-V membrane. In some embodiments of the present invention, the overlapping region on the membrane 102 may form a so-called ridge waveguide, but alternatively this may also be a stripe waveguide (in this case 102 is absent).

Further embodiments of the present invention may further comprise an optional efficient radiation source 104, for example an external laser or an integrated laser such as a VCSEL or any other suitable laser, which provides an optical pump signal. The optical pump signal can access the device towards the III-V membrane through the WG, coupling up to the III-V membrane through a taper, for example. In the membrane, the signal is efficiently absorbed in absorption centers creating a lot of carriers close to the accessing taper coupler. The signal may be absorbed at absorption carriers in the III-V membrane, e.g. in quantum wells (resonant pumping), or more advantageously in the quantum wells as well as in the barriers, (non-resonant pumping). The overlap between the active area of the membrane and the optical pump signal introduced via the waveguide can be large, further increasing the efficiency of the optical pumping of the membrane.

After recombining radiatively (with high efficiency, typical of III-V materials), a large fraction of the broadband light is coupled in the waveguide, typically being a single-mode waveguide 102 and 103, wherein the side-cladding layer 102, the overall cladding layer 105 and the core 103 are indicated. Due to the specific configuration of high refractive index contrast in the materials, as well as through the dimensional configuration used, an efficient coupling can occur. Overall, this fraction of coupled broadband light may be of the order of 10% or higher which shows high efficiency compared to most prior art solutions. For a reference, superluminescent devices (SLEDs) present a typical fraction of 1%.

The coupling means for coupling pump radiation to and LED generated radiation from the III-V material may be present in the optical waveguide, for which in case of silicon or SOI WG, the manufacturing process is very well known and optimized. For instance, coupling means may comprise tapers, which are compact and well known means of coupling. The present invention is not limited thereto, and other means such as optical grating couples may be used.

Some embodiments of the present invention comprise a wide membrane which may additionally act as a thermal heatsink. For example, the effect of heat on structures according to embodiments of the present invention was simulated using multiphysics simulation software. The active region can be considered a source of heat. The entire membrane was clad in DVS-BCB, 320 nm below and 2 microns on top. The buried oxide was 2 microns thick, with the silicon substrate at room temperature. A stripe waveguide of 1.5 micron wide and 120 nm high had a length specific heat resistance of 76 Kcm/W. For the same rib waveguide, where the 20 nm bottom InP SCH was 40 microns wide, the length specific heat resistance had reduced to 45 Kcm/W. These values and geometries are typical in commercial devices, and can be readily implemented in industry. It has been found that for a 20 nm thick InP heat spreader (which has little influence on the optical mode), the thermal resistance can be decreased by 40%.

In the following, examples of devices showing high confinement (hence allowing high absorption) and efficient adiabatic coupling will be described for different types of bonding and membrane materials. The III-V materials may be tailored so as to present an appropriate bandgap for optimization of absorbance of the pumping signal and spontaneous emission, corresponding with the optical (preferably semiconductor such Si) WG. A good confinement factor can be obtained by choosing a suitable combination of cladding and III-V materials, so the optical index of the cladding $n0$ and the optical index of the III-V emitting material $n1$ fulfill the relation:

$$n1-n0>1.$$

The membrane may have a thickness t between $\lambda/20*n1<t<\lambda/2*n1$, hence for each of the wavelengths of the following examples (middle and near IR and visible light), and for each of the III-V materials (GaSb, InP, GaAs), a different optimal thickness may be obtained.

The pump efficiency for optical pumping of the LED may be 96% or higher. The collection efficiency for collecting the radiation from the LED in the waveguide may be larger than 5%.

The influence of the tapers and WG may also be selected for optimization. For example, a taper defined in the III-V material for below 1 micron width usually shows efficient adiabatic coupling.

The following results have been obtained by simulation based on software.

Figure 2:
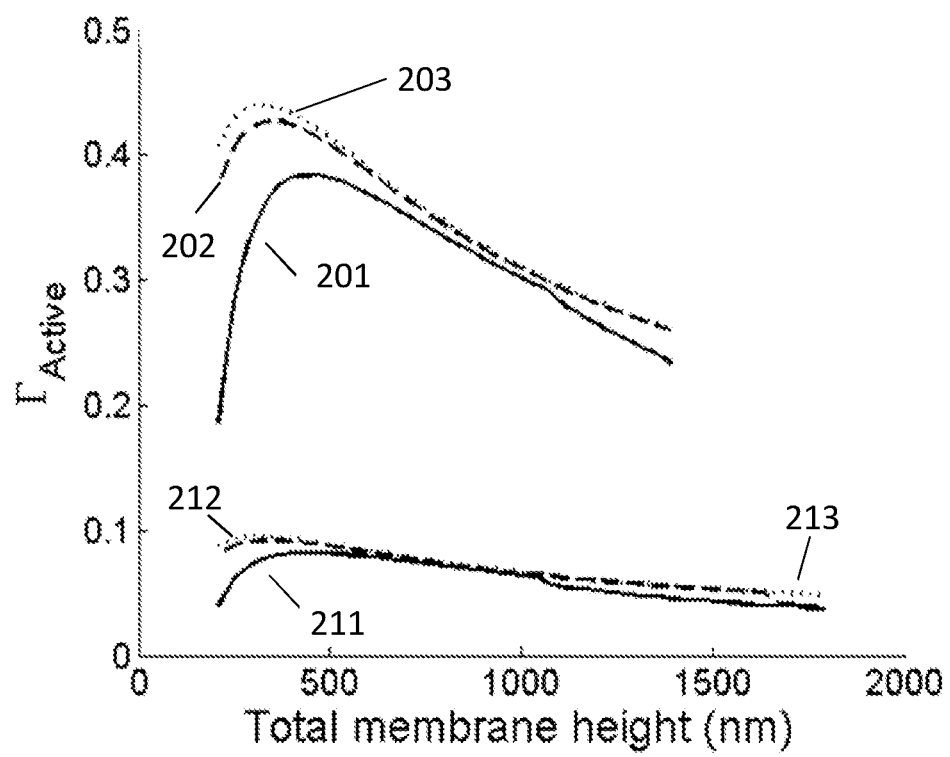
FIG. 2 illustrates the influence of the membrane height on the photon confinement for various widths and resonance schemes, as can be used in embodiments of the present invention, for example in mid-infrared.

In the first example, for the geometry shown in FIG. 1, a mid-infrared signal is provided. A wavelength of 3.5 microns was chosen with GaSb-based quantum-well gain material. The Si waveguide 101 may be 400 nm thick with air cladding. The entire structure may be residing in air, although other possibilities may be implemented. The dimensions and quantum wells/barriers were chosen to optimize the confinement of the optical pump signal. Both quantum well and barrier may absorb the signal. FIG. 2 shows the confinement (Gamma) of a MIR pump light in the active layer of a GaSb membrane, in the absorbing layers, as a function of membrane height, for various membrane widths. Varying the membrane height was done by changing the thickness of the GaSb layers surrounding the active medium consisting of 4 quantum wells and barriers of 10 nm and 30 nm thick respectively. The full upper curve 201 corresponds to non-resonant pumping on a 1 micron-wide III-V membrane, the dashed upper curve 202 to non-resonant pumping on a 1.5 micron III-V membrane, the pointed upper curve 203 to non-resonant pumping on a 2 micron III-V membrane. For resonant pumping, The full lower curve 211 corresponds to 1 micron-wide III-V membrane, the dashed lower curve 212 to 1.5 micron III-V membrane, and the lower upper curve 213 to 2 micron III-V membrane. There is a clear optimum geometry for small heights and wide mesa widths. Additionally, non-resonant pumping schemes can deliver up to four times more confinement than resonant pumping schemes.

An efficient taper from the silicon waveguide to the III-V membrane can be obtained, partly thanks to the limited thickness of the membrane (which may provide with an effective optical index of, for instance, 2.3 for a 1.5 micron wide membrane).

Figure 3:
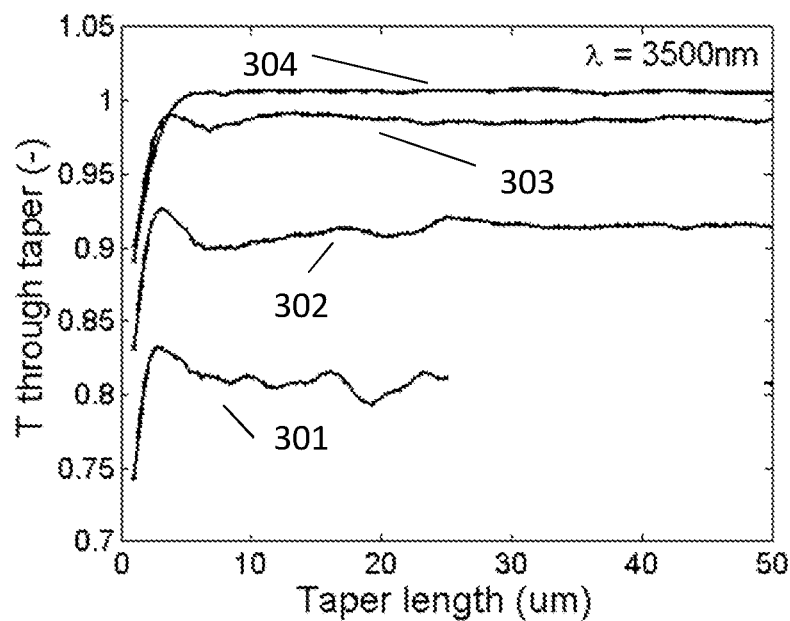
FIG. 3 illustrates a diagram showing transmission behavior as a function of the taper length, as can be used in embodiments of the present invention.

FIG. 3 shows a graph presenting the transmission T through the taper as a function taper length, for various III-V tip widths: the lowest curve 301 with 1 micron tip width, the middle curve 302 with a 0.7 micron tip width, the upper curve 303 with half micron width, and the uppermost curve 304 with a 0.3 micron tip width. These values are valid for a wavelength of 3.5 microns.

Figure 4:
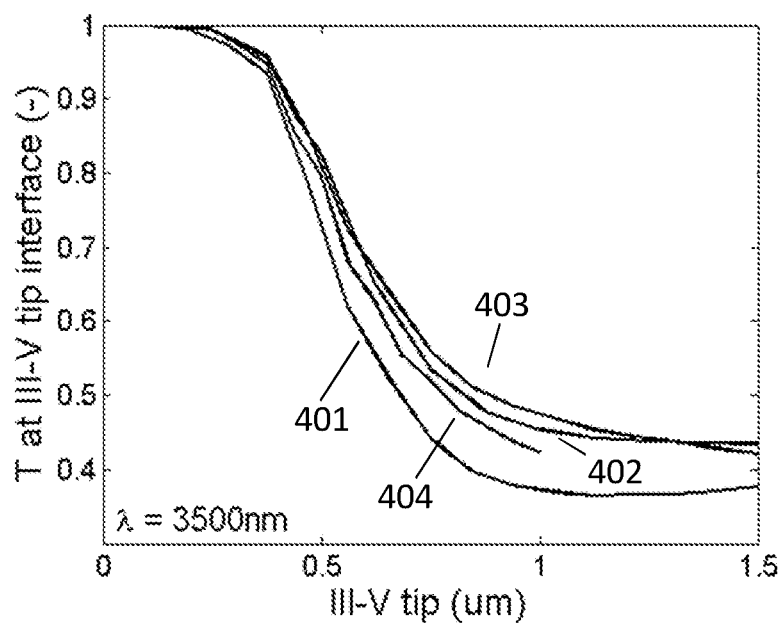
FIG. 4 illustrates a diagram showing transmission behavior at the tip interface as function of the tip size, as can be used in embodiments of the present invention.

On the other hand, FIG. 4 shows a graph presenting the influence of the interface on the transmission through the first interface, as a function of the III-V tip width, for various Si waveguide widths: the lowest curve 401 for a Si width of 3 microns, the middle-upper curve 402 for a width of 2 microns, the uppermost curve (at 1 micron tip) 403 for 1.5 microns and the middle lower curve 404 for 1 micron.

These figures show that the taper can be optimized provided that the III-V tip width is sufficiently small. The length of the taper can be shorter than 10 microns.

Instead of mid-infrared radiation with GaAs material, near-IR may be used (with a wavelength of e.g. 1.5 microns) and InP material. In this case, the Si WG may follow the photonic standard of 220 nm, and due to the bonding, benzocyclobutene polymer (BCB) may be used as cladding material. For example, the entire structure may reside in BCB.

Figure 5:
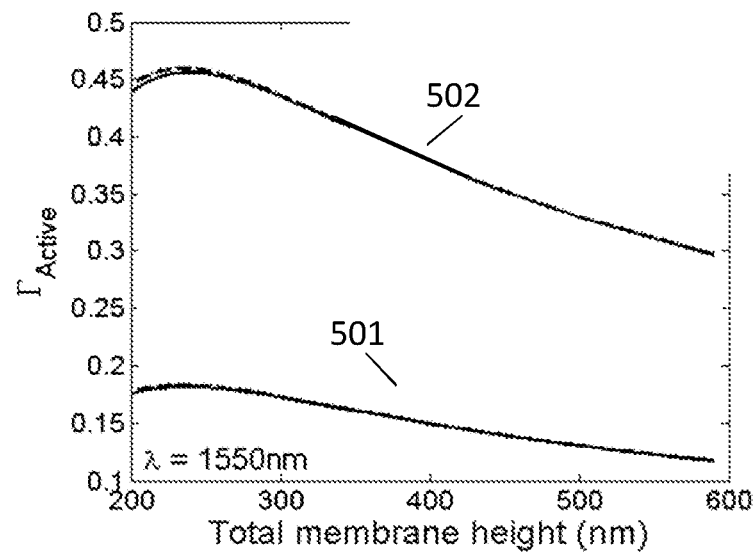
FIG. 5 illustrates a diagram showing confinement for near infrared as a function of the membrane height, as can be used in embodiments of the present invention.
Figure 6:
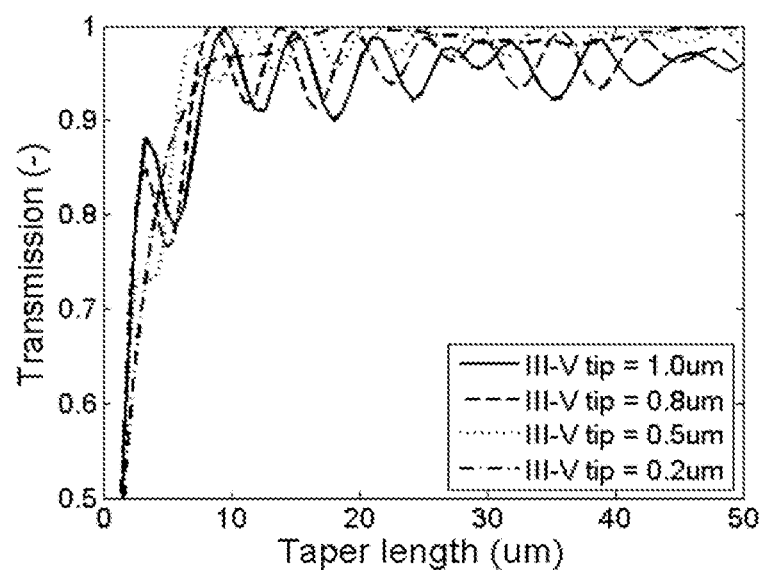
FIG. 6 illustrates transmission as function of taper for different materials and cladding, as can be used in embodiments of the present invention.

The dimensions and quantum wells/barriers were chosen so as to optimize the confinement of the pump light. Both quantum well and barrier may absorb the pump light. FIG. 5 shows the confinement in the absorbing layers as a function of membrane height, for various membrane widths (1, 1.5 and 2 microns). Varying the membrane height was done by changing the thickness of the InP layers surrounding the active medium consisting of 4 quantum wells and barriers of 8 nm and 10 nm thick respectively. Again, there is a clear optimum for small heights and wider mesa widths. The lower curves 501 show the confinement for resonant scheme, which is almost 3 times lower than the upper curves 502 showing the confinement for non-resonant scheme. The width of the membranes seem to play a lesser role in case of InP materials for these configurations: the different curves are hardly resolved in the graph. As before, it can be shown that an efficient taper from the silicon waveguide to the III-V membrane can be made. FIG. 6 shows the transmission through the taper as a function of taper length for various III-V tip width. These figures show that the taper can be optimized, provided that the III-V tip width can be small enough. Note that these tip widths can be made with simple fabrication technology. The length of the taper can be shorter than 20 microns.

Figure 7:
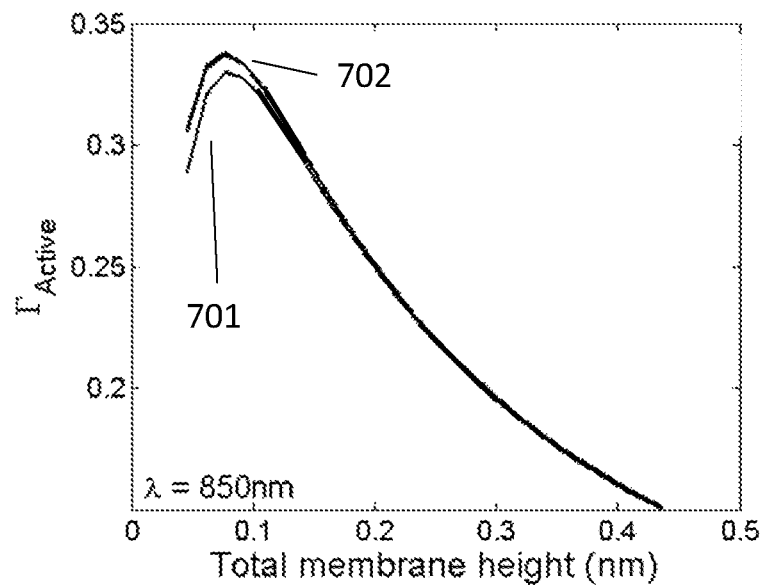
FIG. 7 illustrates a diagram showing confinement for visible spectrum as a function of the membrane height for different membrane materials and cladding, as can be used in embodiments of the present invention.
Figure 8:
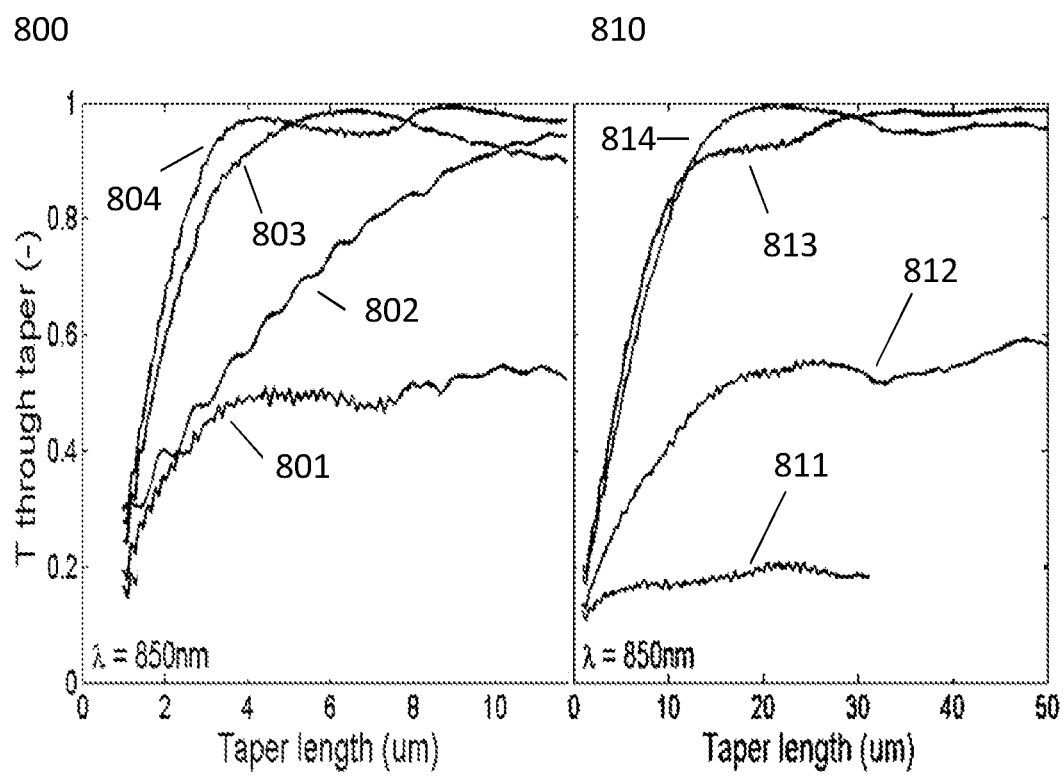
FIG. 8 illustrates a diagram showing transmission behavior as a function of the taper length for different standards of SiN wafer as waveguide substrate, as can be used in embodiments of the present invention.

A third example is described for the case of visible domain. A wavelength of 850 nm was chosen with GaAs based quantum well gain material. Instead of a Si WG, the Si photonics platform is a SiN-based WG platform of 220 nm or 300 nm thickness with oxide cladding. Both thicknesses are discussed. The entire structure is residing in silicon oxide, and the dimensions and quantum wells/barriers were chosen to optimize the confinement of the pump light. Both quantum well and barrier can absorbing the pump signal. FIG. 7 shows the confinement in the absorbing layers as a function of membrane height, for various membrane widths (lower curve 701 for 0.5 microns, upper curve for the overlapping values of confinement for the widths of 1 and 1.5 microns), for non-resonant pumping scheme only. Varying the membrane height was done by changing the thickness of the GaAs layers surrounding the active medium consisting of 4 quantum wells and barriers of 7 nm and 6 nm thick respectively. Also in this example, there is a clear optimum for small heights and wider mesa widths. Certain embodiments of the present invention may comprise an efficient taper comprised in the silicon nitride waveguide for optimal transmission to the III-V membrane. FIG. 8 shows T as a function of the taper length, for the 220 nm SiN WG in the left diagram 800 and for the 300 nm SiN WG in the right diagram 810. The results are given with respect to several tip widths, in case of the left diagram 800, the lowest line 801 corresponds to 250 nm, the lower middle line 802 corresponds to 125 nm, the upper middle 803 corresponds to 200 nm, and the uppermost line 804 corresponds to 120 nm. On the right diagram 810, the lowest line 811 corresponds to 250 nm, the lower middle line 812 corresponds to 200 nm, the upper middle 803 corresponds to 120 nm, and the uppermost line 814 corresponds to 150 nm. Again, these figures proof that the taper can be optimized provided that the III-V tip width can be small enough. Note that these tip widths can be made with simple fabrication technology. The length of the taper can be shorter than 20 microns.

The present invention is not limited by these examples, and any suitable configuration of III-V materials and membrane geometries resulting in comparable values of transmission, confinement for IR or visible radiation are suitable for the present invention.

Embodiments of the present invention can be used as an efficient and broadband source (e.g. 3 dB bandwidth up to 300 nm) in a Si WG. The device consumes low power, because no electric pumping of the LED is necessary. For instance, embodiments of the present invention comprising a pumping laser at 1310 nm would result in a LED band covering between 1400 nm and 1700 nm.

In a second aspect of the present invention, the present invention relates to a method of production of a photonic IC according to embodiments of the first aspect of the present invention. The method of manufacturing or producing a photonics integrated circuit according to embodiments of the present invention comprises obtaining a substrate comprising at least one optical waveguide and combining III-V material with said optical waveguide so as to form a LED on the optical waveguide. According to embodiments, the method comprises introducing a coupling means in the at least one optical waveguide or the III-V membrane. Such a coupling means will be used for transferring an optical pump signal from the optical waveguide up to the III-V membrane. Furthermore, combining the III-V material with the optical waveguide comprises creating a III-V membrane with a thickness between $\lambda/20*n1$ and $\lambda/2*n1$, where $\lambda$ is the operating wavelength and n1 the refractive index of the III-V membrane material. The III-V membrane also is selected to have an absorption capability for absorbing the optical pump signal transferred up to the III-V membrane so as to pump the LED structure thus inducing broadband radiation at a wavelength longer than the wavelength of the optical pump signal.

Combining the III-V material and the optical substrate can be performed in a plurality of ways as will be illustrated more detailed below. These can be easily heterogeneously bonded or printed on top of the SOI waveguides, advantageously ensuring smooth optical interface between SOI and III-V material. Industrial standardized manufacturing routes can be applied to the manufacture of the device. For instance, those embodiments comprising transfer printing have the advantage of allowing placing coupons of different III-V materials precisely and in different locations on the substrate comprising the optical WG (e.g. on the SOI). Following this bonding/printing step, the post-processing steps defining the structure of the LED can be advantageously limited, hence saving time and production costs.

As described above, the method comprises the steps of obtaining an optical waveguide, for example obtaining a semiconductor-on-insulator waveguide on a semiconductor-on-insulator substrate. In some particular embodiments of the present invention, the step comprises obtaining a SOI substrate comprising at least one SOI waveguide.

Several routes of production can be provided, depending on the fabrication process of each part of the device. Some steps according to embodiments of the second aspect may comprise post-processing for obtaining a convenient shape of the device elements.

Figure 9:
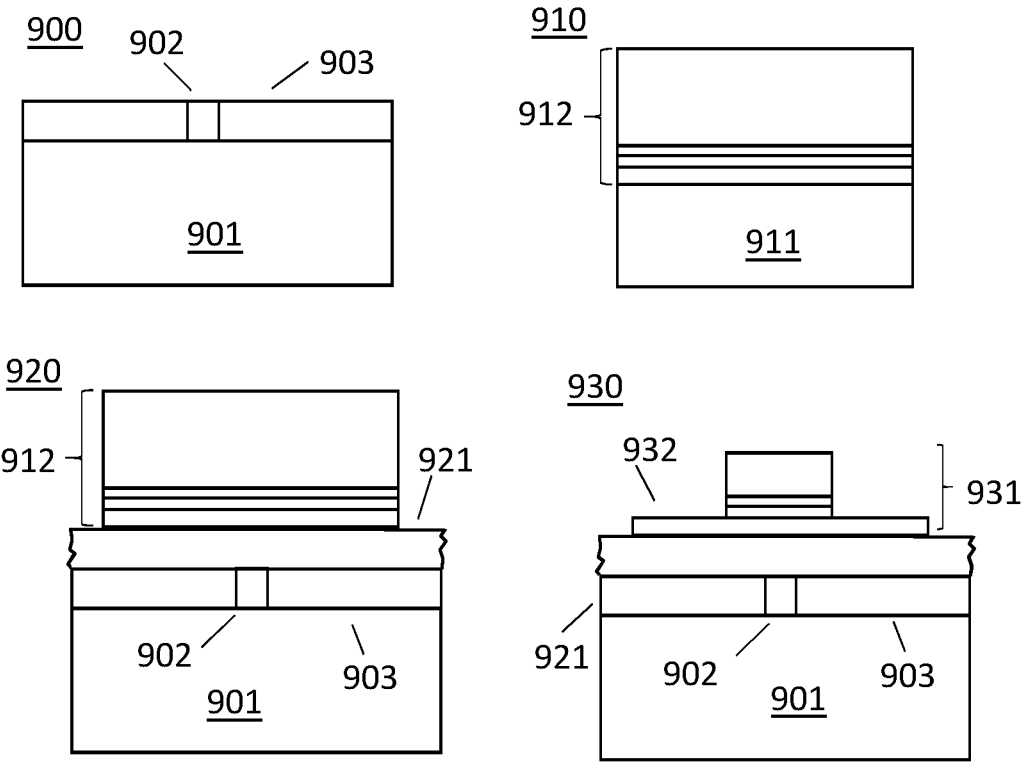
FIG. 9 shows the front view of intermediate products of a method of manufacture of a device according to embodiments of the present invention, comprising bonding.

FIG. 9 shows four intermediate products, 900, 910, 920 and 930, obtained during steps of production of a LED according to embodiments of the first aspect of the invention, the method comprising first bonding the III-V layers on an optical (e.g. SOI) waveguide and then processing a LED. A product 900 is obtainable by a step comprising providing a substrate 901 with one or more waveguides 902, such as a SOI waveguide, which may comprise cladding material 903, for example air or polymer or dielectric material. A further step comprises providing a III-V substrate 911 and a III-V stack 912, which may comprise several different layers. The stack 912 may be obtained, for example, by growth on top of a separate substrate 911. Thus, product 910 is obtained. A further step comprises transferring, for example bonding, the III-V stack 912 on top of the substrate 901 with the 902, via a bonding layer 921. The III-V substrate may be included, or may be included and then removed, or may be removed before transferring the stack, for example via grinding, etching, etc. Thus, product 920 is obtained. A final step comprises processing the III-V substrate 911 and stack 912 so as to form a LED 931 comprising a thin membrane 932 on top of the WG 902, thus obtaining the final device 930.

Figure 10:
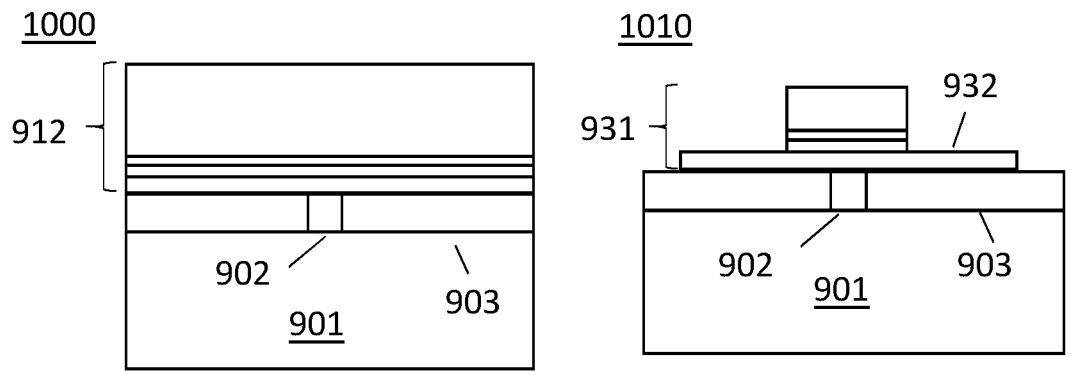
FIG. 10 shows the front view of intermediate products of a method of manufacture of a device according to embodiments of the present invention, comprising layer growth.

An alternative route of production is shown in FIG. 10, wherein the III-V stack is grown directly on the substrate comprising WG. The step of obtaining the product 900 is analogous to the FIG. 9 and is not shown. A further step comprises providing the III-V layer stack 912 on top of the substrate 901 comprising the WG 902, for example by growth, physical or chemical vapour deposition, coating, homogeneous or heterogeneous epitaxy, or any other suitable process. Thus, product 1000 is obtained. In this method, there is no need of a bonding layer. The final step of processing the LED 931 comprising a thin membrane 932 is analogous to the case 930, but in this case the bonding layer is absent. Thus, the final product 1010 is obtained.

Figure 11:
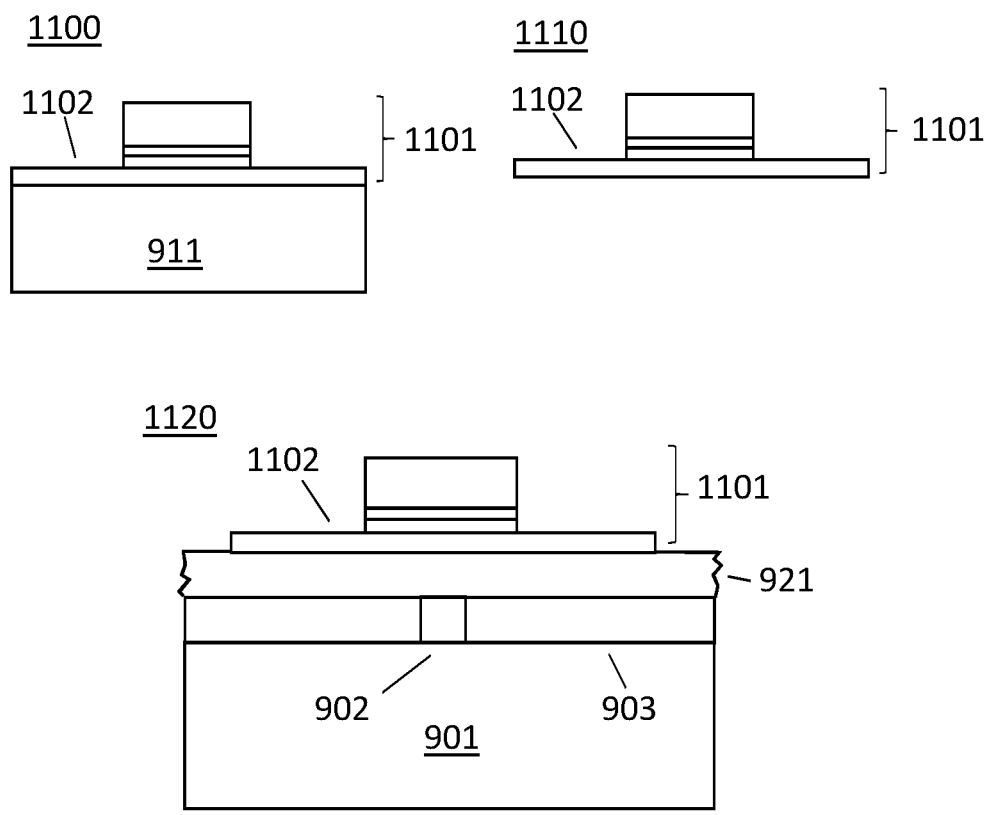
FIG. 11 shows the front view of intermediate products of a method of manufacture of a device according to embodiments of the present invention, comprising processing and bonding.

A further route of production is shown in FIG. 11. The step of providing the product 900 comprising the WG 902 is analogous to the FIG. 9 or 10 and is not shown. A further step of providing the element 910, comprising a III-V substrate and a III-V stack, is analogous to the previous method shown in FIG. 9 and shall not be reproduced again. A further step comprises processing, for example by photolithography, by etching using a mask, or by any other suitable method, the III-V stack 912 so as to form a LED 1101 comprising a membrane 1102 on top of the III-V substrate 911, thus obtaining the product 1100. A further step comprises extracting the LED 1101 comprising the membrane 1102 from the substrate 911, for example by cutting, polishing, etching, or any other suitable means. Thus, product 1110 is obtained. In a final step, the LED 1101 and the substrate 901 comprising the WG 902 are transferred and/or bonded, for example via an optional bonding layer 921, obtaining the final product 1120 (which may be similar to products obtained by the previous routes).

An optional step, applicable to the general method, may be coupling an external source of radiation or integrating it (e.g. integrating a laser) for introducing radiation (e.g. a pump signal) in the WG. For example, external laser sources can be used, coupled to the Si waveguides with horizontal couplers and with grating couplers. Also, very efficient, cheap and commercially available lasers or VCSELs can be used as possible source for the optical pump signal.

These examples of manufacturing routes may be changed, the steps of one route may be readily implemented in a different route, etc. The method may also comprise other intermediate steps. For example, introducing intermediate structures such as lenses or prisms is envisaged. Embodiments of the present method comprising III-V heterogeneous integration may further comprise bonding via a BCB layer or transfer printing. The LED shape can be varied in width and length, only constrained by the physical limitations in the lithography and minimum size for reducing non-radiative carrier recombination at the surface. Tapers can also be patterned at the sides of the LED, in order to optimize the coupling efficiency between the SOI and the III-V material. Tapers of 1 micron or around 1 micron width may be obtained by e-beam lithography, or etching techniques. Alternatively, a thick SOI stack can alleviate the constraints of taper width.

Further, the choice of III-V material stack influences the emitted light band. Hence, the band can be appropriately tailored by using quantum dots and quantum wells. Transfer printing and other techniques can be improved in order to provide defect-free interfaces, hence improving lifetime and efficiency.

The basic steps shown in the aspect of the present invention may be modified and adapted at will, depending on the necessities of material, broadband to be obtained, radiation sources or types of waveguides. Due to the advantageously simple configuration and geometry of the device, it has a great flexibility and it can be applied to a wide field of technologies and devices. While the first aspect and second aspect normally refer to a waveguide in a flat substrate and stacked LEDs, the present invention is not limited thereto.

Figure 14:
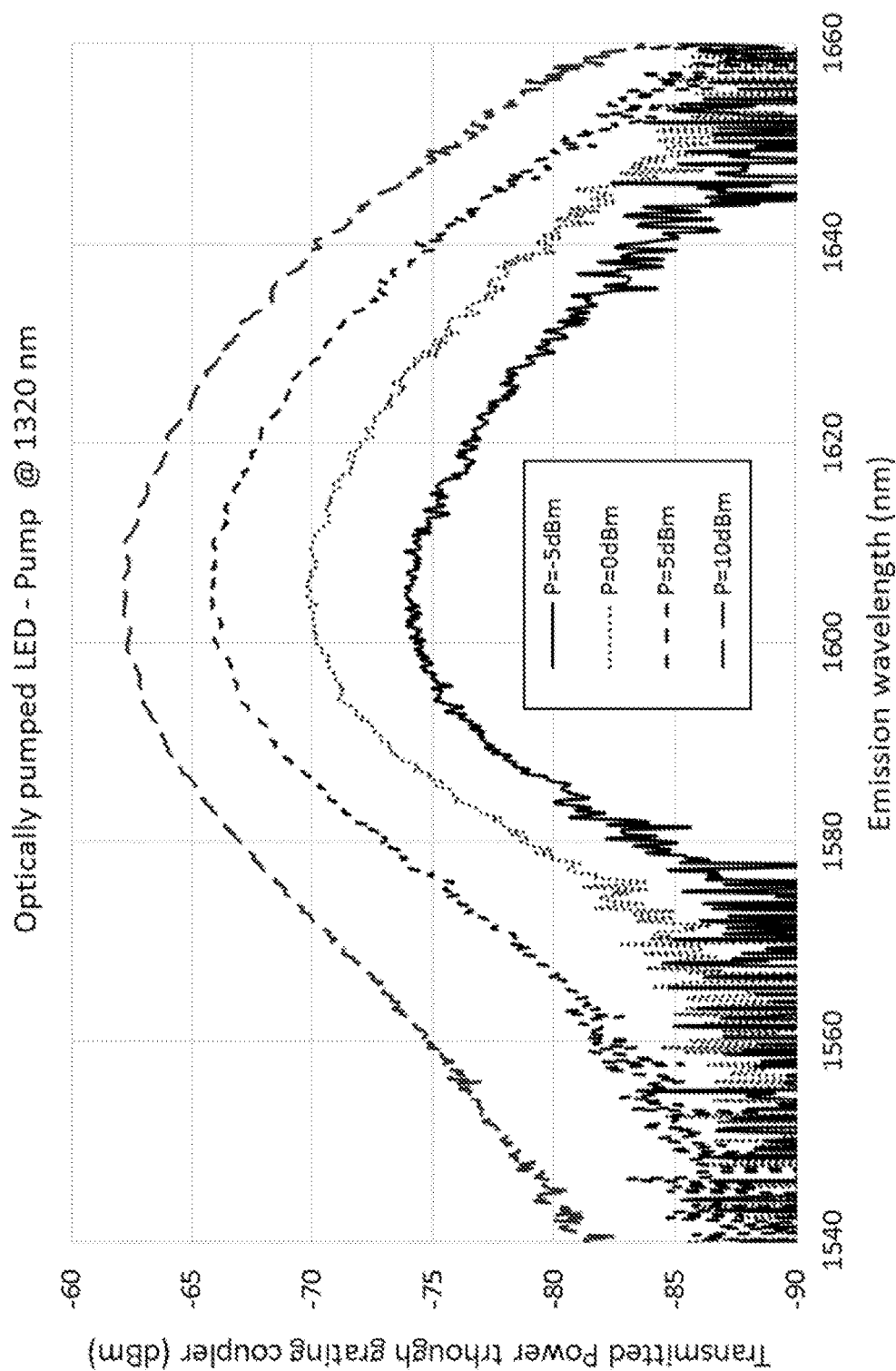
FIG. 14 illustrates the emitted spectrum of an on-chip broadband radiation source according to an embodiment of the present invention for different optical pump powers.

By way of illustration, embodiments of the present invention not being limited thereto, the transmitted power spectrum from the on-chip integrated light source (the emitted spectrum from the integrated light source) is shown in FIG. 14 for different optical pump powers. It can be seen that, the higher the pump power, the more intense the transmitted power is. In the present example, to pump the LED printed on top of SOI waveguide, an external tunable laser source emitting at a wavelength of 1320 nm was coupled into the waveguide circuit using a grating coupler. The spontaneous emission from the LED couples to the forward propagating fundamental mode and is collected through an output grating coupler into an optical spectrum analyzer.

The invention claimed is:

1. An on-chip broadband radiation source comprising:
   at least one optical waveguide comprising a core and a cladding material,
   a III-V membrane, a LED structure being implemented thereon, the III-V membrane having a thickness between $\lambda/20*n1$ and $\lambda/2*n1$, where $\lambda$ is the operating wavelength and $n1$ the refractive index of the III-V membrane material, the III-V membrane being positioned on top of the optical waveguide, and there being a refractive index contrast such that $n1-n0>1$, with $n1$ being the refractive index of the III-V membrane material, $n0$ the refractive index of the cladding material surrounding the III-V membrane at least in a direction perpendicular to the membrane,
   wherein the at least one optical waveguide or the III-V membrane comprises a coupling means for transferring an optical pump signal from the optical waveguide up to the III-V membrane, and
   wherein the III-V membrane has an absorption capability for absorbing the optical pump signal transferred up to the III-V membrane so as to pump the LED structure thus inducing broadband radiation at a wavelength longer than the wavelength of the optical pump signal, and the emitted signal is coupled back into the waveguide.

2. The on-chip broadband radiation source according to claim 1, wherein the optical waveguide is arranged for receiving an optical pump signal and for guiding the optical pump signal in the optical waveguide towards the III-V membrane.

3. The on-chip broadband radiation source according to claim 2, wherein the on-chip broadband source furthermore comprises an integrated radiation source for generating the optical pump signal, said integrated radiation source being coupled to the optical waveguide for directing the optical pump signal towards the III-V membrane.

4. The on-chip broadband radiation source according to claim 3, wherein the integrated radiation source is a VCSEL.

5. The on-chip broadband radiation source according to claim 1, wherein the III-V membrane and the optical waveguide are configured for having a good confinement of the pump signal in the III-V membrane.

6. The on-chip broadband radiation source according to claim 1, wherein the optical waveguide and said thin III-V membrane are configured with respect to each other so as to couple the broadband radiation towards the optical waveguide.

7. The on-chip broadband radiation source according to claim 1, wherein the coupling means is provided on the optical waveguide.

8. The on-chip broadband radiation source according to claim 1, wherein the coupling means is a taper.

9. The on-chip broadband radiation source according to claim 1, wherein the optical waveguide is a semiconductor-on-insulator waveguide.

10. The on-chip broadband radiation source according to claim 1, wherein the III-V material has a bandgap selected so that the pump signal can be absorbed and the spontaneous emission corresponds with the optical waveguide.

11. A photonics integrated circuit comprising an on-chip broadband radiation source according to claim 1.

12. The on-chip broadband radiation source according to claim 1, wherein the optical waveguide is a silicon on-insulator waveguide.

13. A method for manufacturing a photonics integrated circuit, the method comprising:
   obtaining a substrate comprising at least one optical waveguide,
   combining III-V material with said optical waveguide so as to form a LED on the optical waveguide,
   wherein the method furthermore comprises introducing a coupling means in the at least one optical waveguide or the III-V membrane for transferring an optical pump signal from the optical waveguide up to the III-V membrane, and
   wherein combining the III-V material with the optical waveguide comprises creating a III-V membrane with a thickness between $\lambda/20*n1$ and $\lambda/2*n1$, where $\lambda$ is the operating wavelength and $n1$ the refractive index of the III-V membrane material, the III-V membrane being positioned on top of the optical waveguide, and there being a refractive index contrast such that $n1-n0>1$, with $n1$ being the refractive index of the III-V membrane material and with $n0$ being the refractive index of the cladding material surrounding the III-V membrane at least in a direction perpendicular to the membrane, and having an absorption capability for absorbing the optical pump signal transferred up to the III-V membrane so as to pump the LED structure thus inducing broadband radiation at a wavelength longer than the wavelength of the optical pump signal.

14. The method according to claim 13, wherein said combining comprises:
   transferring the III-V material to the substrate so that the III-V material is on the top of the optical waveguide, and
   processing said III-V material to create the LED.

15. The method according to claim 13, wherein said combining comprises:
   creating the LED structure based on the III-V material, and
   combining the substrate and the LED structure so as to obtain the LED on the optical waveguide.

16. The method according to claim 13, wherein said combining comprises directly growing a LED structure on top of the optical waveguide on the substrate.

17. The method according to claim 13, wherein providing a III-V membrane comprises heterogeneously bonding the III-V membrane on the optical waveguide.

* * * * *